United States Patent [19]
Yamada

[11] Patent Number: 5,719,504
[45] Date of Patent: Feb. 17, 1998

[54] SEMICONDUCTOR DEVICE HAVING A SCAN PATH

[75] Inventor: Shitaka Yamada, Tokyo, Japan

[73] Assignee: NEC Corporation, Tokyo, Japan

[21] Appl. No.: 591,976

[22] Filed: Jan. 29, 1996

[30] Foreign Application Priority Data

Jan. 27, 1995 [JP] Japan .................. 7-031347

[51] Int. Cl.$^6$ .................. H03K 19/00; H03K 19/173
[52] U.S. Cl. .................. 326/16; 326/46; 371/25.1
[58] Field of Search .................. 326/16, 39, 46, 326/40; 371/22.3, 25.1

[56] References Cited

U.S. PATENT DOCUMENTS

| | | | |
|---|---|---|---|
| 5,132,974 | 7/1992 | Rosales | 371/25.1 |
| 5,175,447 | 12/1992 | Kawasaki et al. | 326/16 |
| 5,225,724 | 7/1993 | Scarra' et al. | 326/16 |
| 5,252,917 | 10/1993 | Kadowaki | 326/16 |
| 5,317,205 | 5/1994 | Sato | 326/16 |
| 5,495,487 | 2/1996 | Whetsel, Jr. | 371/25.1 |

FOREIGN PATENT DOCUMENTS 346821  2/1991  Japan .

*Primary Examiner*—Edward P. Westin
*Assistant Examiner*—Richard Roseen
*Attorney, Agent, or Firm*—Sughrue, Mion, Zinn, Macpeak & Seas, PLLC

[57] ABSTRACT

In a semiconductor device including a logic gate combination circuit and a plurality of scan registers or flip-flops, a scan path is provided to serially connect the flip-flops to each other. Scan clock signals are sequentially generated and transmitted to the scan registers. A delay time among the scan clock signals is approximately smaller than an operation time of each of the scan registers.

11 Claims, 13 Drawing Sheets

SEMICONDUCTOR DEVICE HAVING A SCAN PATH

BACKGROUND OF THE INVENTION

1. Field of the Invention

The present invention relates to a semiconductor device including a logic gate combination circuit and a plurality of flip-flops having a scan path for a test mode.

2. Description of the Related Art

In a logic circuit including a large number of logic gates such as AND circuits NAND circuits, OR circuits, NOR circuits, exclusive OR circuits, exclusive NOR circuits and the like, and a large number of flip-flops interposed between the logic gates, the flip-flops usually cannot be accessed directly from the exterior. Therefore, in order to test the logic gates, the logic gates have to be operated step by step, which increases test time.

In order to reduce the test time for the logic gates included in the logic circuit, a scan path is provided to serially connect the flip-flops to each other between a scan-in terminal and a scan-out terminal. That is, when the scan path is activated, the flip-flops can serve as a shift register. Thus, input data can be written from the scan-in terminal through the scan path into an arbitrary flip-flop, and output data can be read from an arbitrary flip-flop through the scan path to the scan-out terminal. Note that such flip-flops are called scan registers.

A first prior art scan path includes a plurality of scan registers each formed by a master latch circuit (flip-flop) and a slave latch circuit (flip-flop), thus avoiding data passing-through effect due to the clock skew. This will be explained later in detail.

In the first prior art scan path, however, two kinds of clock signals, i.e., a master clock signal for the master latch circuit and a slave clock signal for the slave latch circuits are required, thus making the control complex.

A second prior art scan path includes a plurality of scan registers each formed by a single flip-flop. In the second prior art scan path, the scan registers are divided into a plurality of blocks, and each of a plurality of clock signals is supplied to one of the blocks. A longer delay time is given to the blocks on the post stages. Also, a delay circuit is interposed between two of the blocks. Thus, data passing-through effect can be also avoided. This will be also explained later in detail.

In the second prior art scan path, however, a large number of delay circuits are required to reduce the integration. Also, when designing a layout, the number of scan registers per one block and the delay time of the delay circuits has to be considered, which increases the design time.

A third prior art scan path also includes a plurality of scan registers each formed by a single flip-flop (see: JP-A-3-46821). In the third prior art scan path, every two of the scan registers form blocks, and each of a plurality of clock signals is supplied to one of the blocks. A longer delay time is given to the blocks in the post stages. In this case, the clock signal supplied to the odd numbered blocks is opposite to the clock signal supplied to the even numbered blocks. Thus, a data passing-through effect can be also avoided. This will also be explained later in detail.

In the third prior art scan path, however, two kinds of clock signals opposite in phase are required, thus making it the control complex. Also, when designing a layout, the delay time of scan clock signals has to be considered in dependency of the location of the scan clock signals, which also increases the design time.

SUMMARY OF THE INVENTION

It is an object of the present invention to provide a semiconductor device including a scan path capable of simplifying the control thereof and reducing the design time.

According to the present invention, in a semiconductor device including a logic gate combination circuit and a plurality of scan registers or flip-flops, a scan path is provided to serially connect the flip-flops to each other. Scan clock signals are sequentially generated and transmitted to the scan registers. A delay time among the scan clock signals is approximately smaller than an operation time of each of the scan registers.

The scan clock signals can be generated by a plurality of delay circuits connected in series, each of which has the above-mentioned delay time. In this case, the delay circuits receive a single common scan clock signal. Therefore, the control can be simplified, and also, the design time can be reduced.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, an example of a logic circuit and prior art scan paths will be explained with reference to FIGS. 1, 2, 3A through 3H, 4, 5A through 5F, 6 and 7A through 7G.

Figure 1:
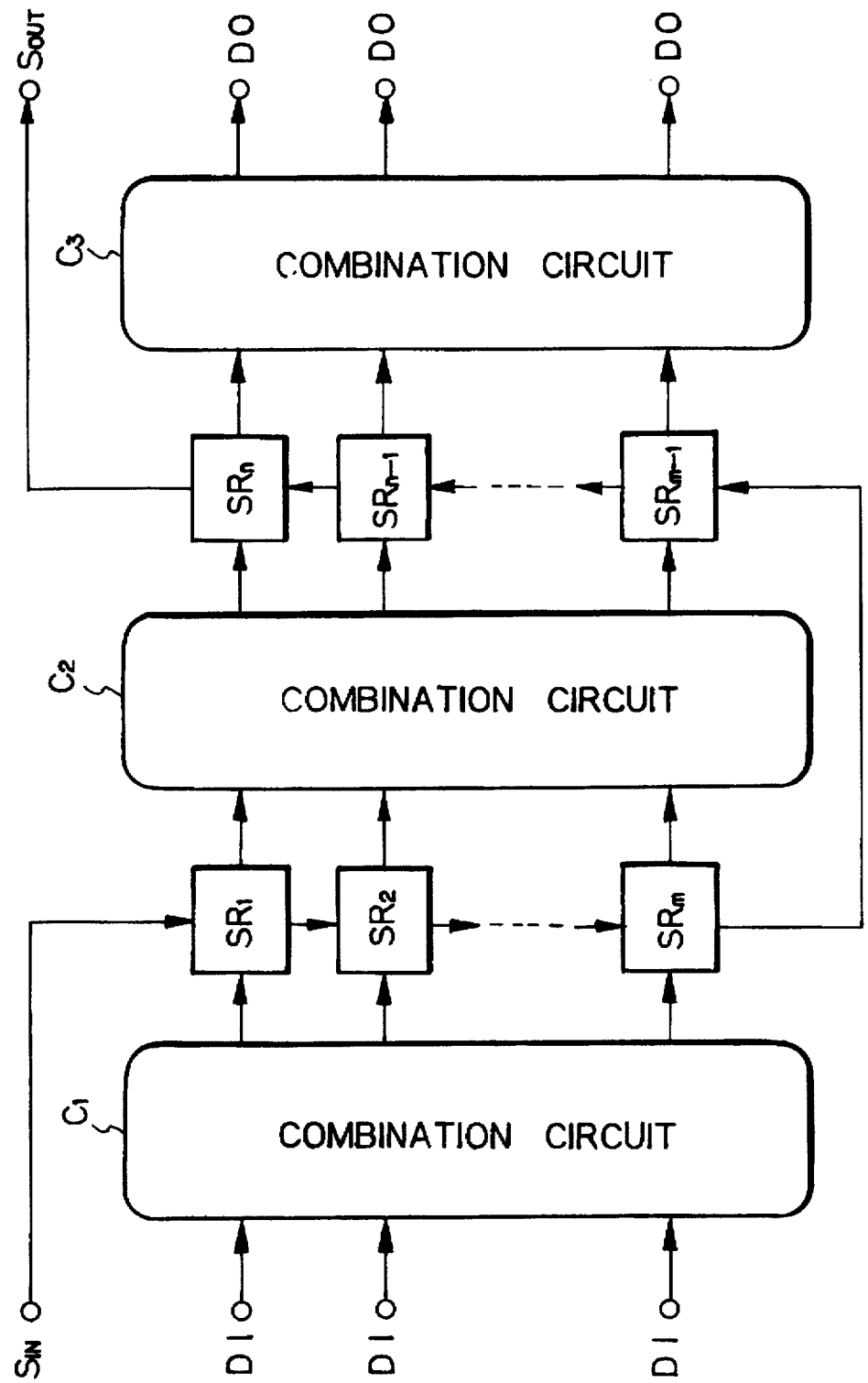
FIG. 1 is a circuit diagram illustrating an example of a logic circuit.

In FIG. 1, which illustrates an example of a logic circuit, registers (flip-flops) $SR_1, SR_2, \ldots, SR_m, SR_{m+1}, \ldots, SR_{n-1}$, $SR_n$ are interposed between logic gate combination circuits $C_1, C_2$ and $C_3$ formed by AND circuits, NAND circuits, OR circuits, NOR circuits, exclusive OR circuits, exclusive NOR circuits and the like. Input data DI is supplied to the logic gate combination circuit $C_1$, and output data DO is output from the logic gate combination circuit $C_3$.

Since the registers $SR_1, SR_2, \ldots, SR_{m+1}, \ldots, SR_{n-1}, SR_n$ 1, cannot be accessed directly from the exterior, the test time of the logic circuit is increased. In order to reduce the test time, a scan path is provided to serially connect the registers $SR_1, SR_2, \ldots, SR_m, SR_{m+1}, \ldots, SR_{n-1}, SR_n$, to each other between a scan-in terminal $S_{IN}$ and a scan-out terminal $S_{OUT}$, so that the registers $S_1, SR_2, \ldots, SR_m, SR_{m+1}, \ldots, SR_{n-1}$, can serve as a shift register. Thus, the registers $SR_1, SR_2, \ldots, SR_m, SR_{m+1}, \ldots, SR_{n-1}, SR_n$ are called scan registers. Therefore, test data is written into arbitrary scan registers via the scan path from the scan-in terminal $S_{IN}$. Then, the test data is input in parallel to the logic gate combination circuits $C_2$ and $C_3$ simultaneously with supplying input data DI to the logic gate combination circuit $C_1$, thus operating the logic gate combination circuits $C_1$, $C_2$ and $C_3$. Then, test data is read out of arbitrary scan registers to the scan-out terminal $S_{OUT}$ simultaneously with output data DO of the logic gate combination circuit $C_3$. Finally, the test data at the scan-out terminal $S_{OUT}$ and/or the output data DO is compared with expected data, thus determining whether or not the logic gates of the logic gate combination circuits $C_1$, $C_2$ and $C_3$ are normal.

Figure 2:
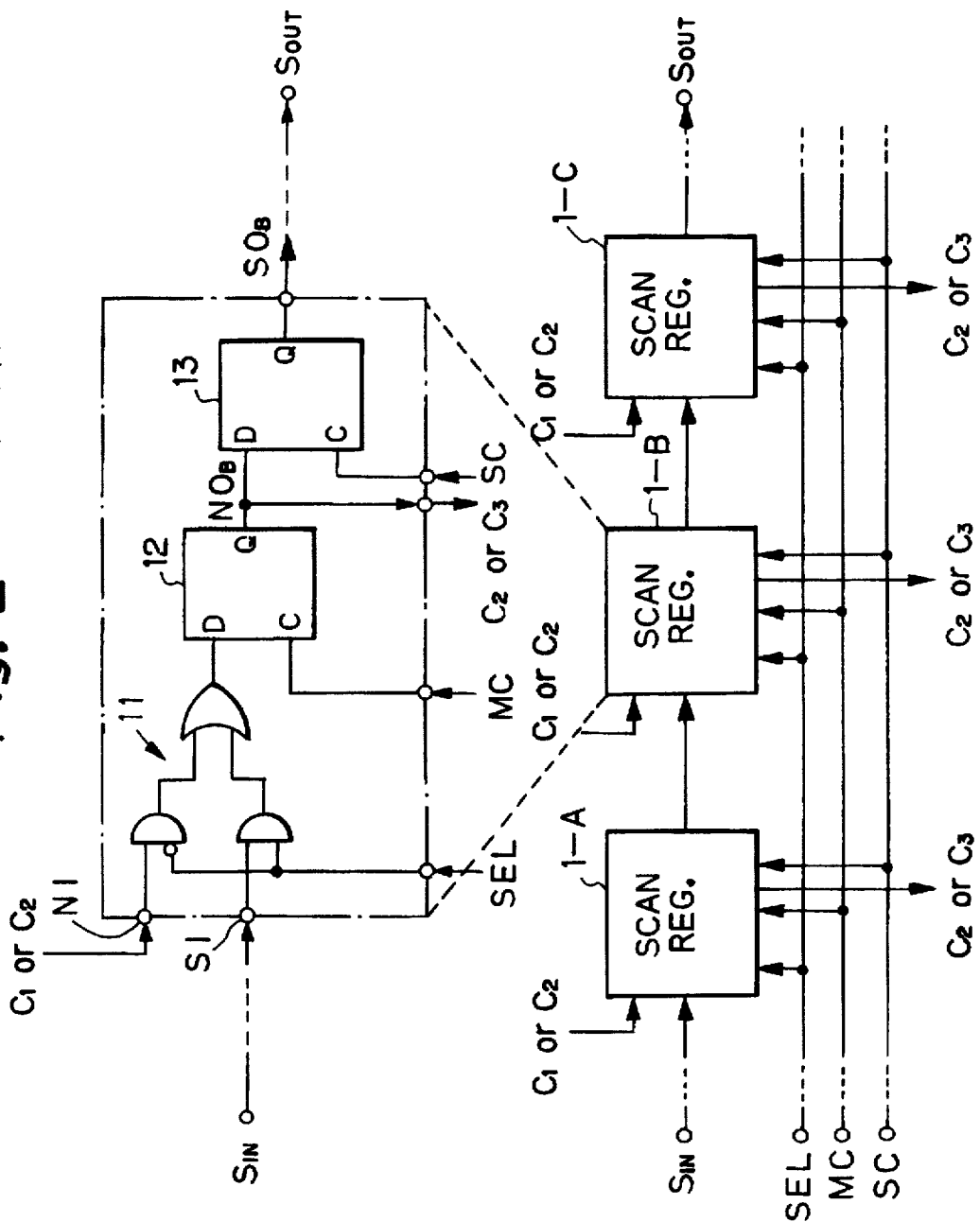
FIG. 2 is a circuit diagram illustrating a first prior art scan path.

In FIG. 2, which illustrates a first prior art scan path, scan registers 1-A, 1-B and 1-C are connected in series between the scan-in terminal $S_{IN}$ and the scan-out terminal $S_{OUT}$. Each of the scan registers 1-A, 1-B and 1-C includes a selector 11 for selecting either a normal data input NI or a scan data input SI in accordance with a mode selection signal at a mode selection terminal SEL. In this case, the normal data input NI is connected to the logic gate combination circuit $C_1$ or $C_2$, and the scan data input SI is connected to a prestage one of the scan registers or the scan-in terminal $S_{IN}$. For example, when the mode selection signal "0" (logic gate operation mode), the selector 11 selects the normal data input NI. Converse, when the mode selection signal is "1" (scan mode), the selector 11 selects the scan data input SI.

Data selected by the selector 11 is supplied to a data input D of a master latch circuit (D-type flip-flop) 12 clocked by a master clock signal at a master clock terminal MC. The output (Q) of the master latch circuit 12 is connected to the logic gate combination circuit $C_2$ or $C_3$ and to a slave latch circuit (D-type flip-flop) 13 clocked by a slave clock signal at a slave clock terminal SC.

The scan mode operation of the scan path of FIG. 2 is explained next with reference to FIGS. 3A through 3H. Here, the mode selection signal at the terminal SEL is "1". Also, $NO_A$, $NO_B$ and $NO_C$ designate output signals of the master latch circuits 12 of the scan registers 1-A, 1-B and 1-C, respectively, and $SO_A$, $SO_B$ and $SO_C$ designate output signals of the slave latch circuits 12 of the scan registers 1-A, 1-B and 1-C, respectively.

Figure 3:
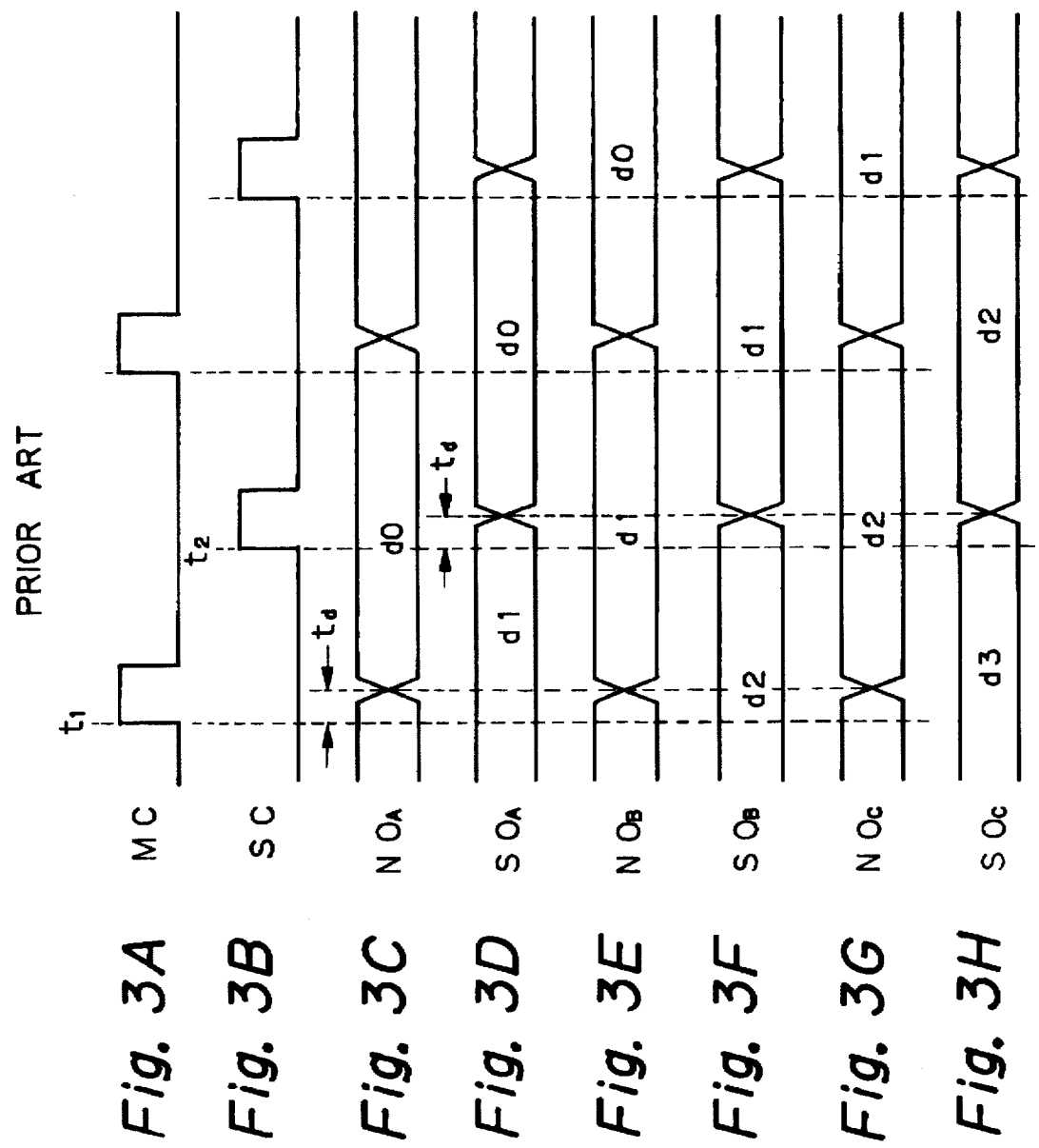
FIGS. 3A through 3H are timing diagrams for explaining the operation of the scan path of FIG. 2.

As shown in FIGS. 3A and 3B, the master clock signal MC and the slave clock signal SC are non-overlapped.

At time $t_1$, when the master clock signal MC rises, data d0, d1 and d2 are latched by the master latch circuits 12 of the scan registers 1-A, 1-B and 1-C, respectively, with a delay time $t_d$. As a result, as shown in FIGS. 3C, 3E and 3G, the output signals $NO_A$, $NO_B$ and $NO_C$ of the master latch circuits 12 are d0, d1 and d2, respectively.

Next, at time $t_2$, when the slave clock signal SC rises, data d0, d1 and d2 are latched by the slave latch circuits 13 of the scan registers 1-A, 1-B and 1-C, respectively, with a delay time $t_d$. As a result, as shown in FIGS. 3D, 3F and 3H, the output signals $SO_A$, $SO_B$ and $SO_C$ of the slave latch circuits 13 are d0, d1 and d2, respectively.

Thus, a one-bit shift operation is performed upon the scan path by one pulse of the master clock signal MC and one pulse of the slave clock signal SC. Therefore, data passing-through effect can be avoided by the skew between the master clock signal MC and the slave clock signal SC.

In the scan path of FIG. 2, however, two kinds of clock signals, i.e., the master clock signal MC for the master latch circuit, 12 and the slave clock signal SC for the slave latch circuit 13 are required, thus making it the control complex.

Figure 4:
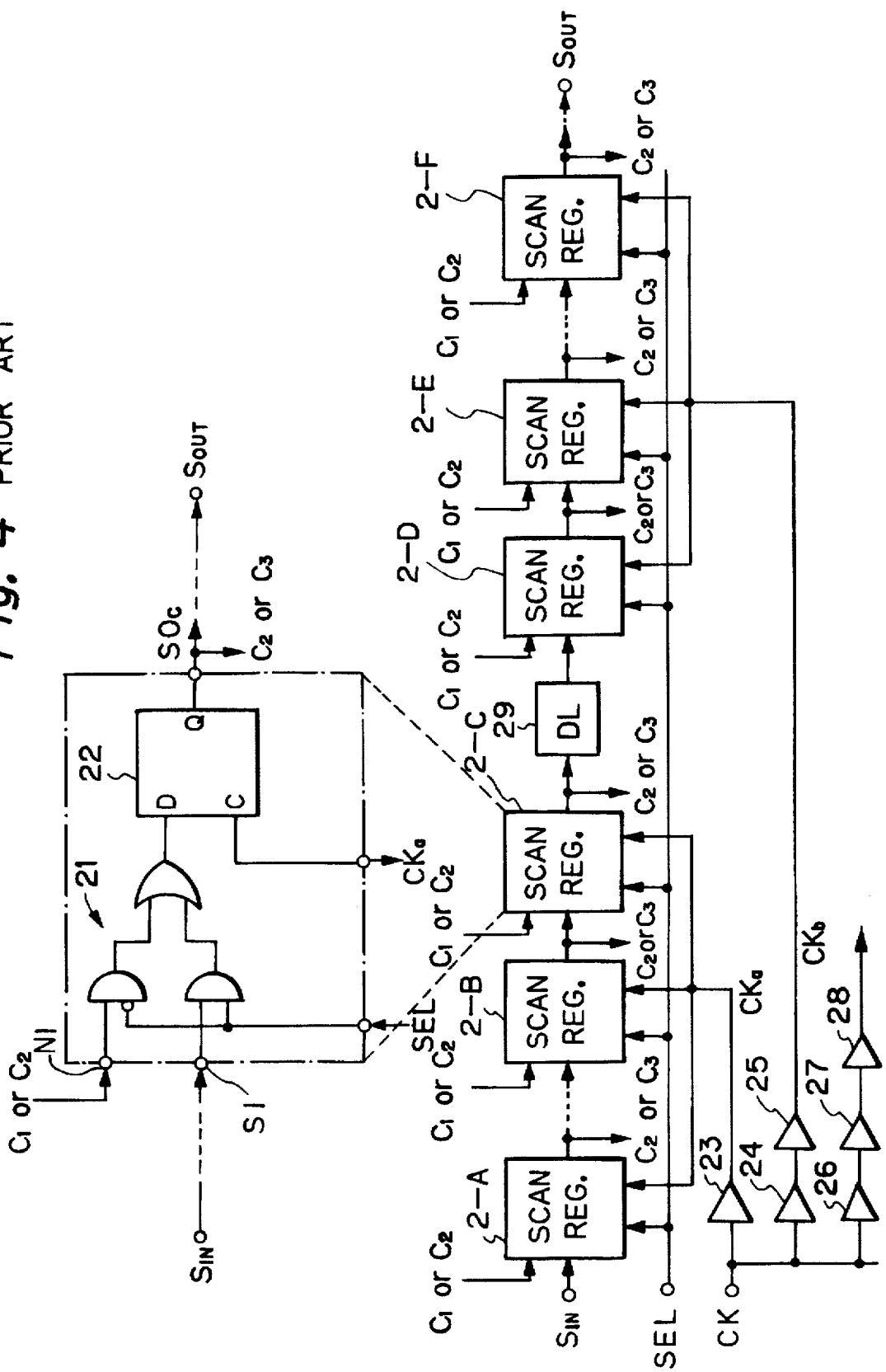
FIG. 4 is a circuit diagram illustrating a second prior art scan path.

In FIG. 4, which illustrates a second prior art scan path, scan registers 2-A, 2-B, . . . , are connected in series between the scan-in terminal $S_{IN}$ and the scan-out Terminal $S_{OUT}$. The scan registers 2-A, 2-B and 2-C form a block, and the scan registers 2-D, 2-E and 2-F form a block. That is, the scan registers are divided into a plurality of blocks. The first block is supplied with a clock signal $CK_a$, the second block is supplied with a clock signal $CK_b$, and so on.

Each of the scan registers 2-A, 2-B, . . . includes a selector 21 for selecting either the normal data input NI or the scan data input SI in accordance with the mode selection signal at the mode selection terminal SEL.

Data selected by the selector 21 is supplied t o a data input D of a D-type flip-flop 22 clocked by the clock signal such $CK_a$, $CK_b$, . . . .

The clock signals $CK_a$, $CK_b$, . . . are generated by delay circuits (drivers) 23 through 28 which receive a common clock signal CK. That is, a skew is present between the clock signals $CK_a$, $CK_b$, . . . . Thus, a long delay time is given to the blocks in the post stages.

Also, a delay circuit 29 is interposed between the blocks.

The scan mode operation of the scan path of FIG. 4 is explained next with reference to FIGS. 5A through 5F. Here, the mode selection signal at the terminal SEL is "1". Also, $SI_B$, $SI_C$, $SI_D$ and $SI_E$ designate the scan data at the inputs of the scan registers 2-B, 2-C, 2-D and 2-E, respectively.

Figure 5:
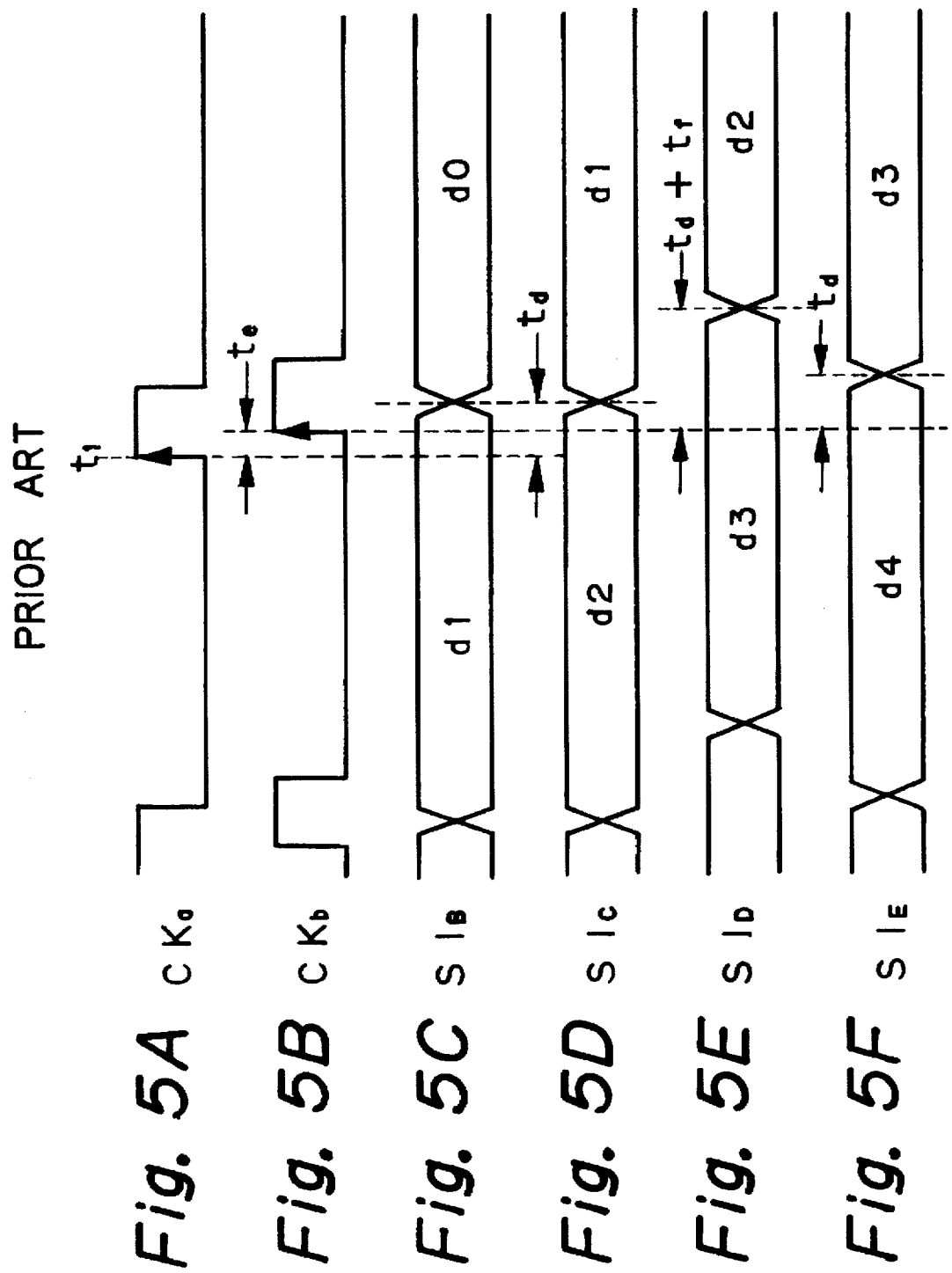
FIGS. 5A through 5F are timing diagrams for explaining the operation of the scan path of FIG. 4.

As shown in FIGS. 5A and 5B, a skew $t_e$ is present between the clock signals $CK_a$ and $CK_b$.

At time $t_1$, when the clock signal $CK_a$ rises, data d1 and d2 are latched by the flip-flops 22 of the scan registers 2-B and 2-C, respectively, with a delay time $t_d$. As a result, as shown in FIGS. 5C and 5D, the scan data $SI_B$ and $SI_C$ of the scan registers 2-B and 2-C are d0 and d1, respectively. In this case, as shown in FIG. 5E, the scan data $SI_C$ of time scan register 2-D becomes d2 with a delay time $t_d + t_f$, where $t_f$ is a delay time of the delay circuit 29.

Next, at time $t_2$, when the clock signal $CK_b$ rises, data d3 are latched by the flip-flops 22 of the scan register 2-D, with a delay time $t_d$. As a result, as shown in FIG. 5F, the scan data $SI_E$ of the scan register 2-E is d3.

Thus, a one-bit shift operation is performed upon the scan path by using one pulse of the clock signal $CK_a$ and one pulse of the clock signal $CK_b$, . . . . Therefore, data passing-through effect can be avoided by the skew between the clock signals $CK_a$, $CK_b$, . . . and the delay time of the delay circuit 29.

In the scan path of FIG. 4, however, a large number of delay circuits are required to reduce the integration. Also, when designing a layout, the number of scan registers per block and the delay time of the delay circuits has to be considered, which increases the design time.

Figure 6:
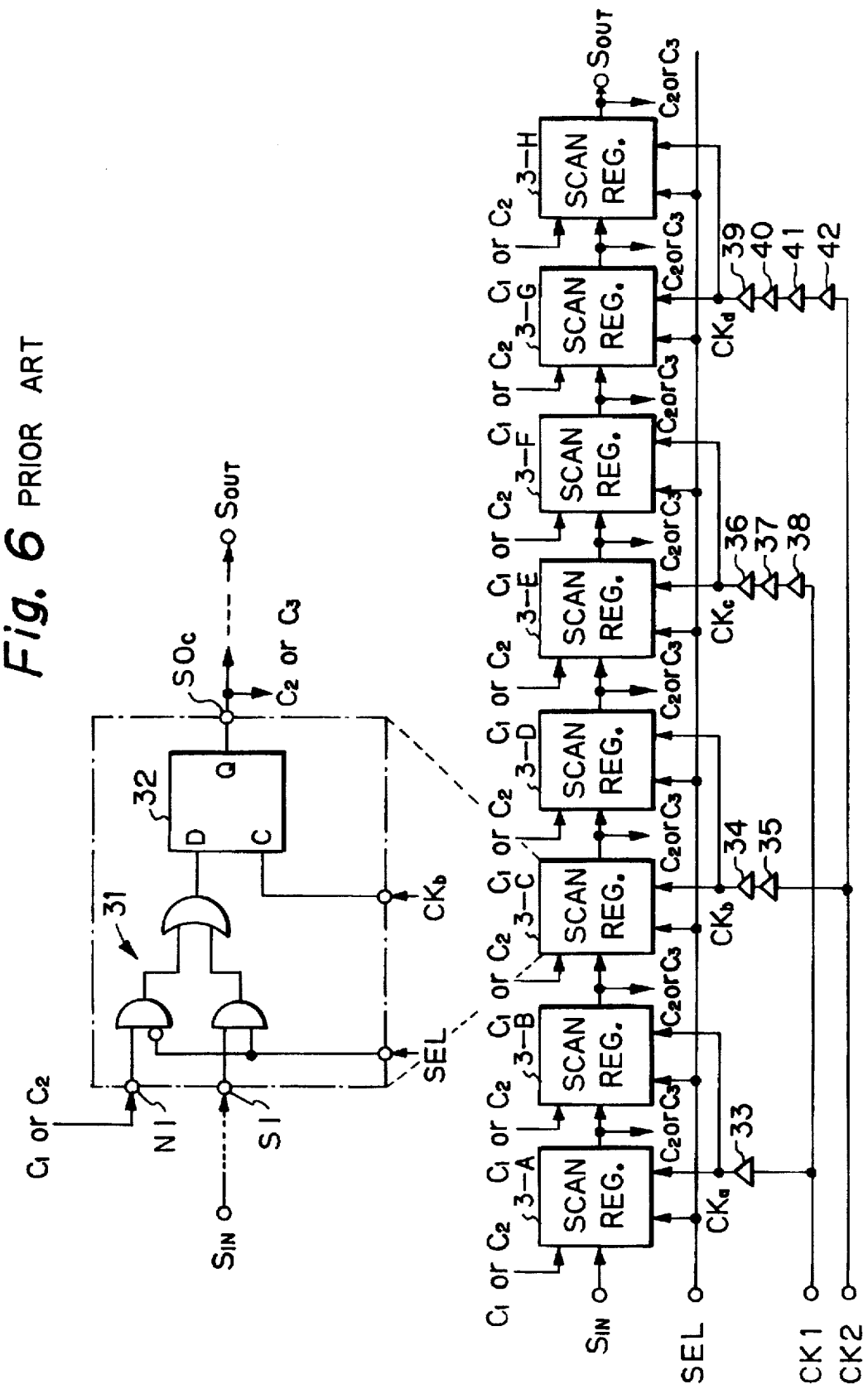
FIG. 6 is a circuit diagram illustrating a third prior art scan path.

In FIG. 6, which illustrates a third prior art scan path (see: JP-A-3-46821), scan registers 3-A through 3-H are connected in series between the scan-in terminal $S_{IN}$ and the scan-out terminal $S_{OUT}$. Two of the scan registers 3-A through 3-H form a block. That is, the scan registers are divided into a plurality of blocks. The first block is supplied with a clock signal $CK_a$, the second block is supplied with a clock signal $CK_b$, and so on.

Each of the scan registers 3-A through 3-H includes a selector 31 for selecting either the normal data input NI or the scan data input SI in accordance with the mode selection signal at the mode selection terminal SEL.

Data selected by the selector 31 is supplied to a data input D of a D-type 22 clocked by the clock signal such $CK_a$, $CK_b$, ....

The clock signals $CK_a$ and $CK_c$ are generated by delay circuits (drivers) 33 through 35 which receive a common clock signal CK1. Similarly, the clock signals $CK_b$ and $CK_d$ are generated by delay circuits (drivers) 36 through 42 which receive a common clock signal CK2. That is, a skew is present between the clock signals $CK_a$, $CK_b$, $CK_c$ and $CK_d$, .... Thus, a long delay time is given to the blocks in the post stages.

The scan mode operation of the scan path of FIG. 6 is explained next with reference to FIGS. 7A through 7G. Here, the mode selection signal at the terminal SEL is "1". Also, $SO_A$, $SO_B$, $SO_C$ and $SO_D$ designate the scan data at the outputs of the scan registers 3-A, 3-B, 3-C and 3-D, respectively.

Figure 7:
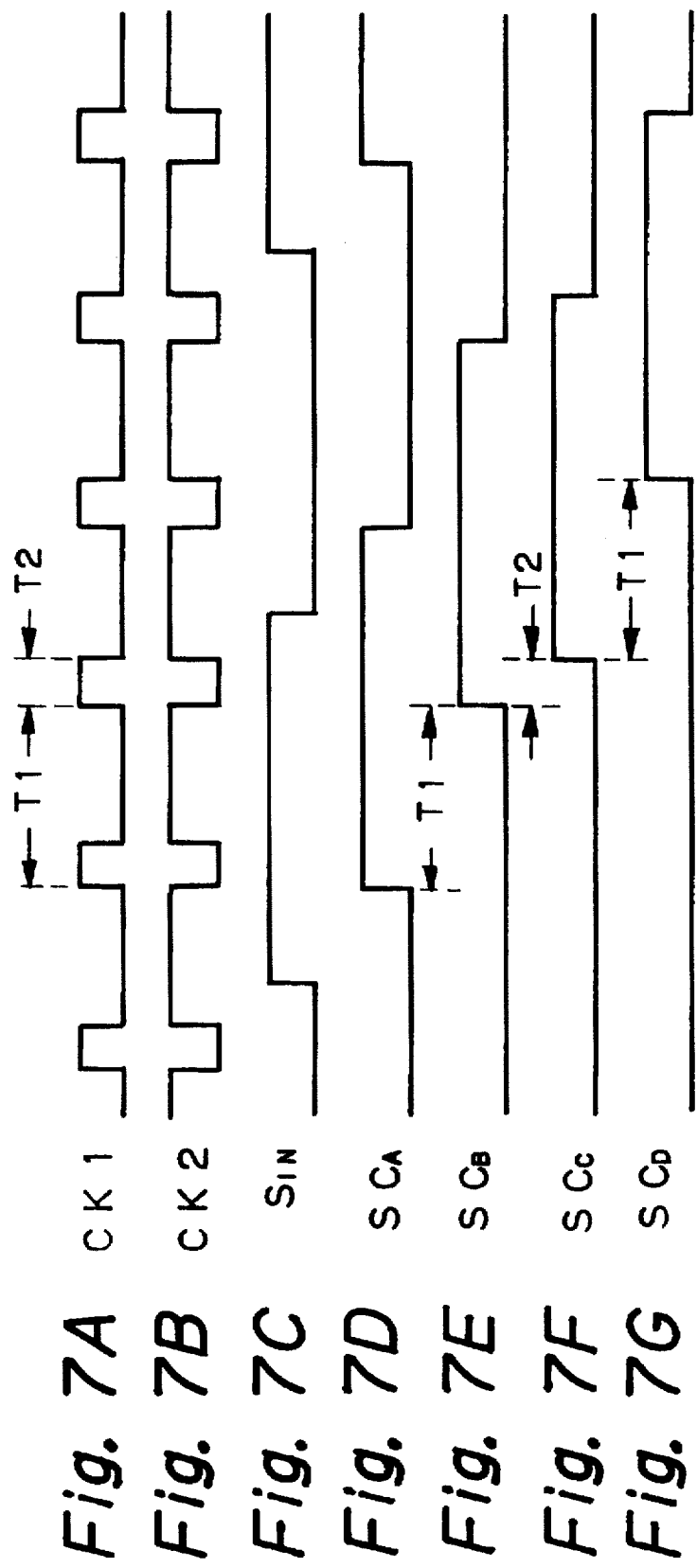
FIGS. 7A through 7G are timing diagrams for explaining the operation of the scan path of FIG. 6.

As shown in FIGS. 7A and 7B, the clock signal CK1 is opposite The clock signal CK2.

The scan data at the scan-in terminal SI is shown in FIG. 7C.

In response to the clock signal CK1, a skew T1 is present between the outputs $SO_A$ and $SO_B$ of the scan registers 3-A and 3-B due to the operation time of the scan register 3-A, as shown in FIGS. 7D and 7E. Also, in response to the clock signal CK2, a skew TI is present between the outputs $SO_C$ and $SO_D$ of the scan registers 3-C and 3-D due to the operation time of the scan register 3-C, as shown in FIGS. 7F and 7G. Further, a skew T2 is present between the outputs $SO_A$ and $SO_B$ of the scan registers 3-A and 3-B and the outputs $SO_C$ and $SO_D$ of the scan registers 3-C and 3-D.

In the scan path of FIG. 6, however, two kinds of clock signals opposite in phase are required, thus making it the control complex. Also, when designing a layout, the delay time of scan clock signals has to be considered in dependency of the location of the scan clock signals, which also increases the design time.

Figure 8:
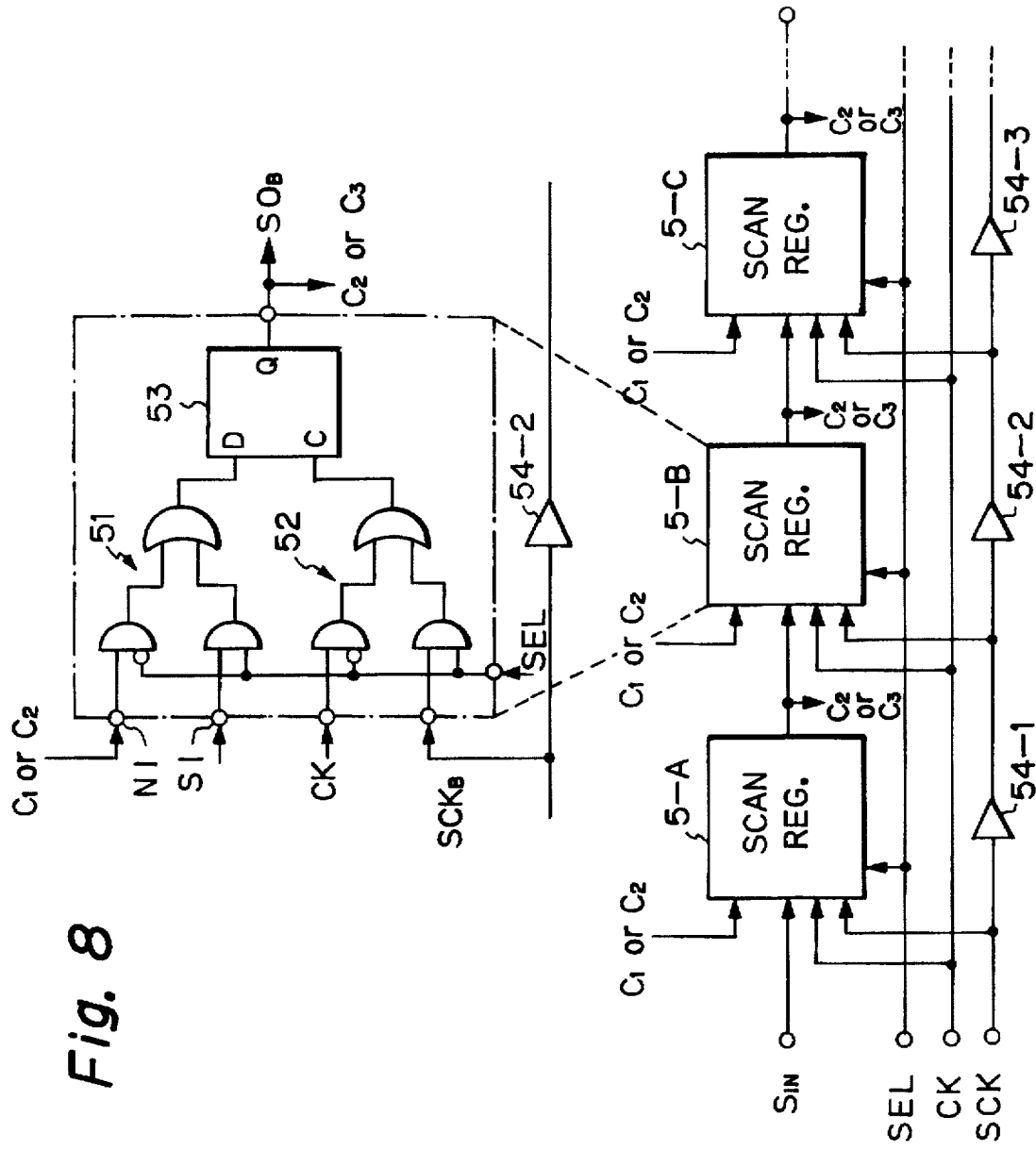
FIG. 8 is a circuit diagram illustrating a first embodiment of the scan path according to the present invention.

In FIG. 8, which illustrates a first embodiment of the present invention, scan registers 5-A, 5-B, 5-C, ... are connected in series between the scan-in terminal $S_{IN}$ and the scan-out terminal $S_{OUT}$.

Each of the scan registers 5-A, 5-B, 5-C, ... includes a selector 51 for selecting either the normal data input NI or the scan data input SI in accordance with the mode selection signal SEL. Also, each of the scan registers 5-A, 5-B, 5-C, ... includes a selector 52 for selecting either a normal clock signal CK or a scan clock signal such as $SCK_B$ in accordance with the mode selection signal SEL.

The scan clock signals $SCK_A$, $SCK_B$, $SCK_C$, ... are generated by delay circuits 54-1, 54-2, 54-3, ... connected in series, which receive a common scan clock signal SCK. In this case, a delay time $t_c$ of each of the delay circuits 54-1, 54-2, 54-3, ... is smaller than an operation time $t_d$ of each of the scan registers 5-A, 5-B, 5-C, .... In FIG. 8, note that $SCK_A$=SCK.

The scan operation of the scan path of FIG. 8 is explained next with reference to FIGS. 9A through 9F. Here, the mode selection signal at the terminal SEL is "1". Also, $SI_A$, $SI_B$ and $SI_C$ designate the scan data at the scan data inputs SI of the scan registers 5-h, 5-B and 5-C.

Figure 9:
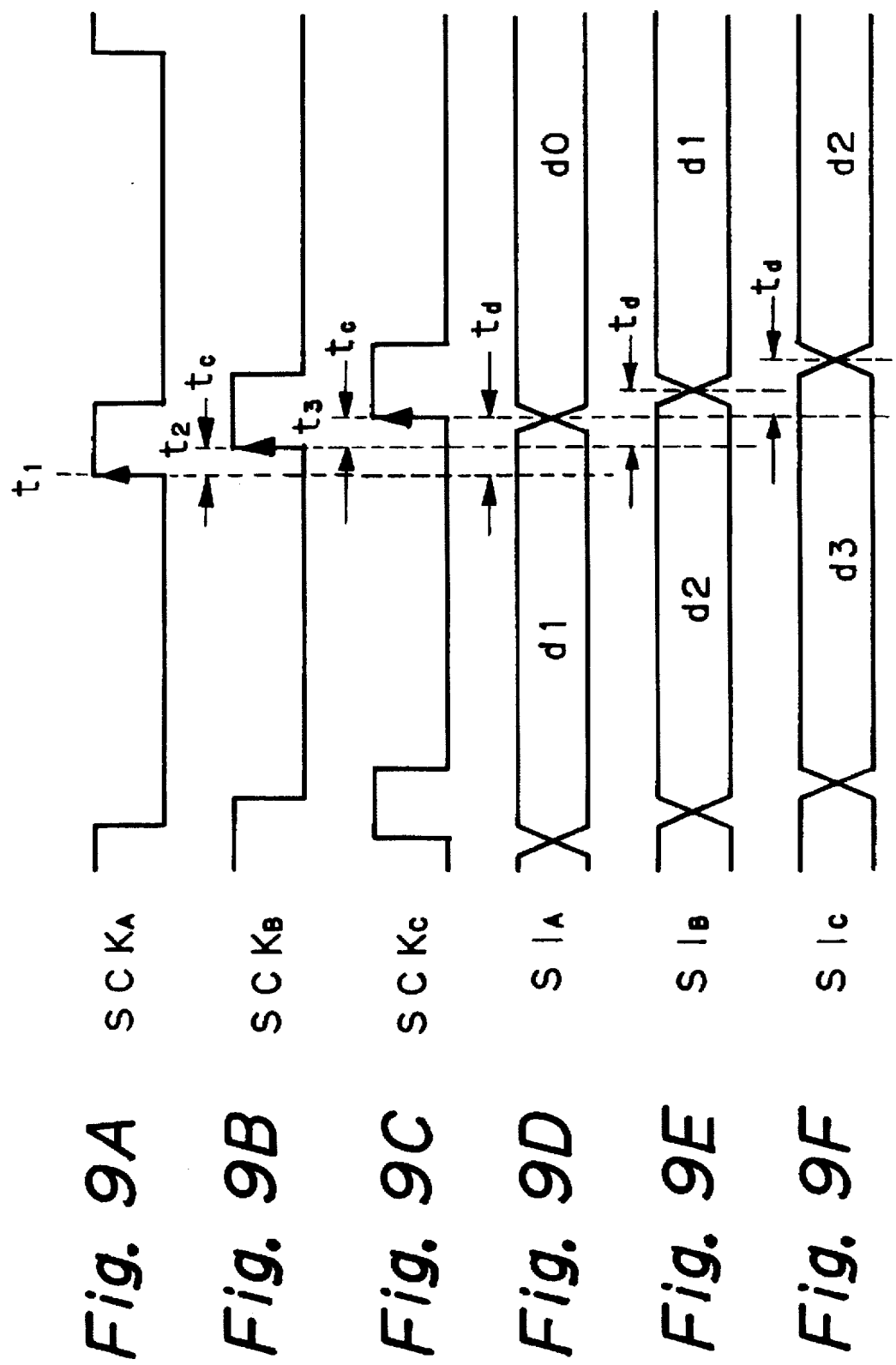
FIGS. 9A through 9F are timing diagrams for explaining the operation of the scan path of FIG. 8.

As shown in FIGS. 9A, 9B and 9C, the scan clock signals $SCK_A$, $SCK_B$ and $SCK_C$ are sequentially generated with the delay time $t_c$.

At time $t_1$, when the scan clock signal $SCK_A$ rises, the scan data at the input SI of the scan register 5-A is changed from d1 to d0 with an operation time $t_d$ thereof, as shown in FIG. 9D.

At time $t_2$, when the scan clock signal $SCK_B$ rises, the scan data at the input SI of the scan register 5-B is changed from d2 to d1 with an operation time $t_d$ thereof, as shown in FIG. 9E.

At time $t_3$, when the scan clock signal $SCK_C$ rises, the scan data at the input SI of the scan register 5-C is changed from d3 to d2 with an operation time $t_d$ thereof, as shown in FIG. 9F.

Since $t_c<t_d$, the operation time of the scan registers 5-A, 5-B, 5-C, ... including a hold time of the flip-flop 53 is surely guaranteed. Therefore, data passing-through effect can be avoided.

Figure 10:
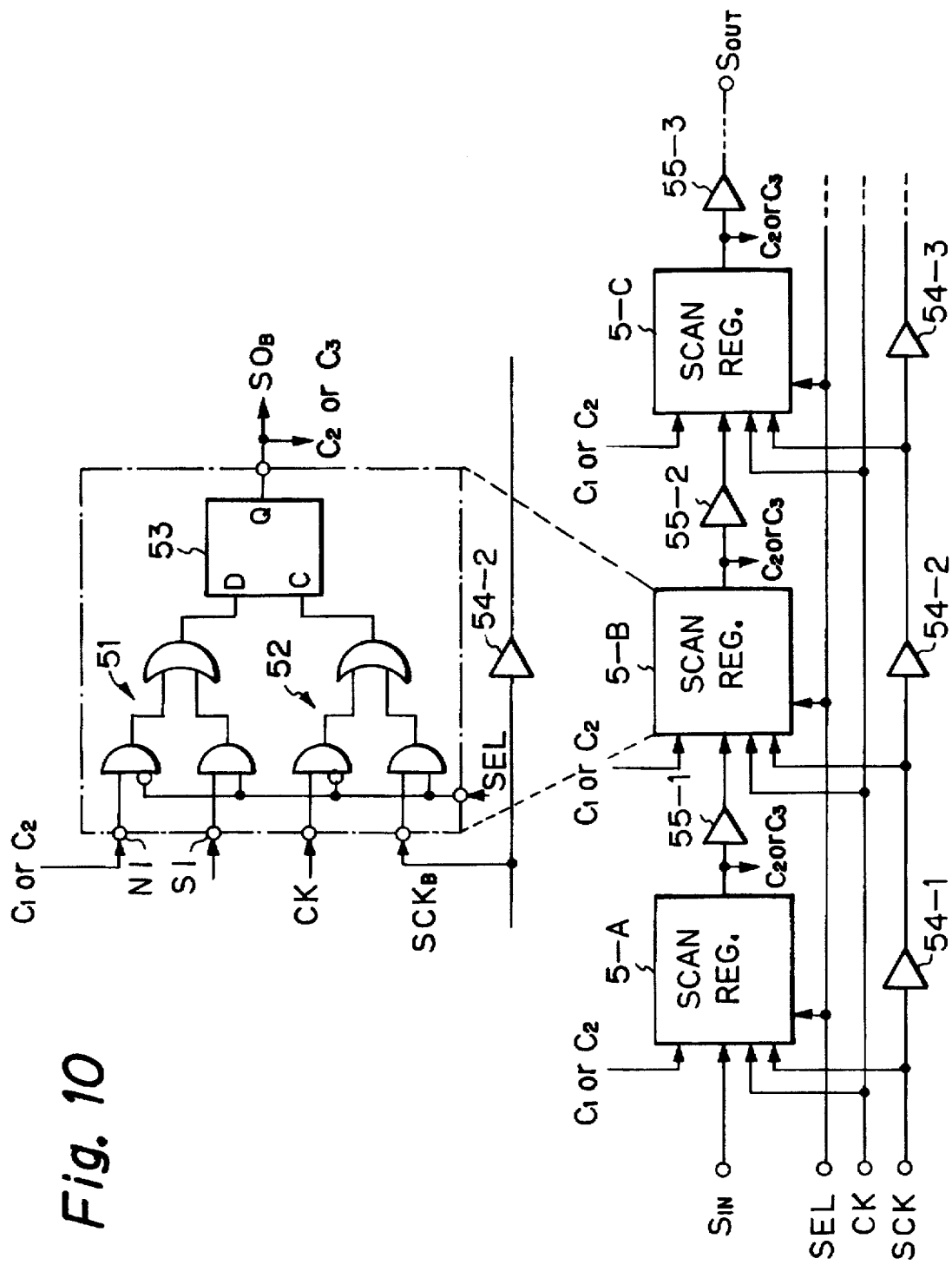
FIG. 10 is a circuit diagram illustrating a second embodiment of the scan path according to the present invention.

In FIG. 10, which illustrates a second embodiment of the present invention, delay circuits 55-1, 55-2, 55-3, ... are interposed between two adjacent ones of the scan registers 5-A, 5-B, 5-C, ... of FIG. 8. Each of the delay circuits 55-1, 55-2, 55-3 ... has a delay time $t_c'$. As a result, the change of the scan data is delayed by $t_c'$ as compared with the scan path of FIG. 8.

The scan operation of the scan path of FIG. 10 is explained next with reference to FIGS. 11A through 11F.

Figures 11A, 11B, 11C, 11D, 11E, 11F:
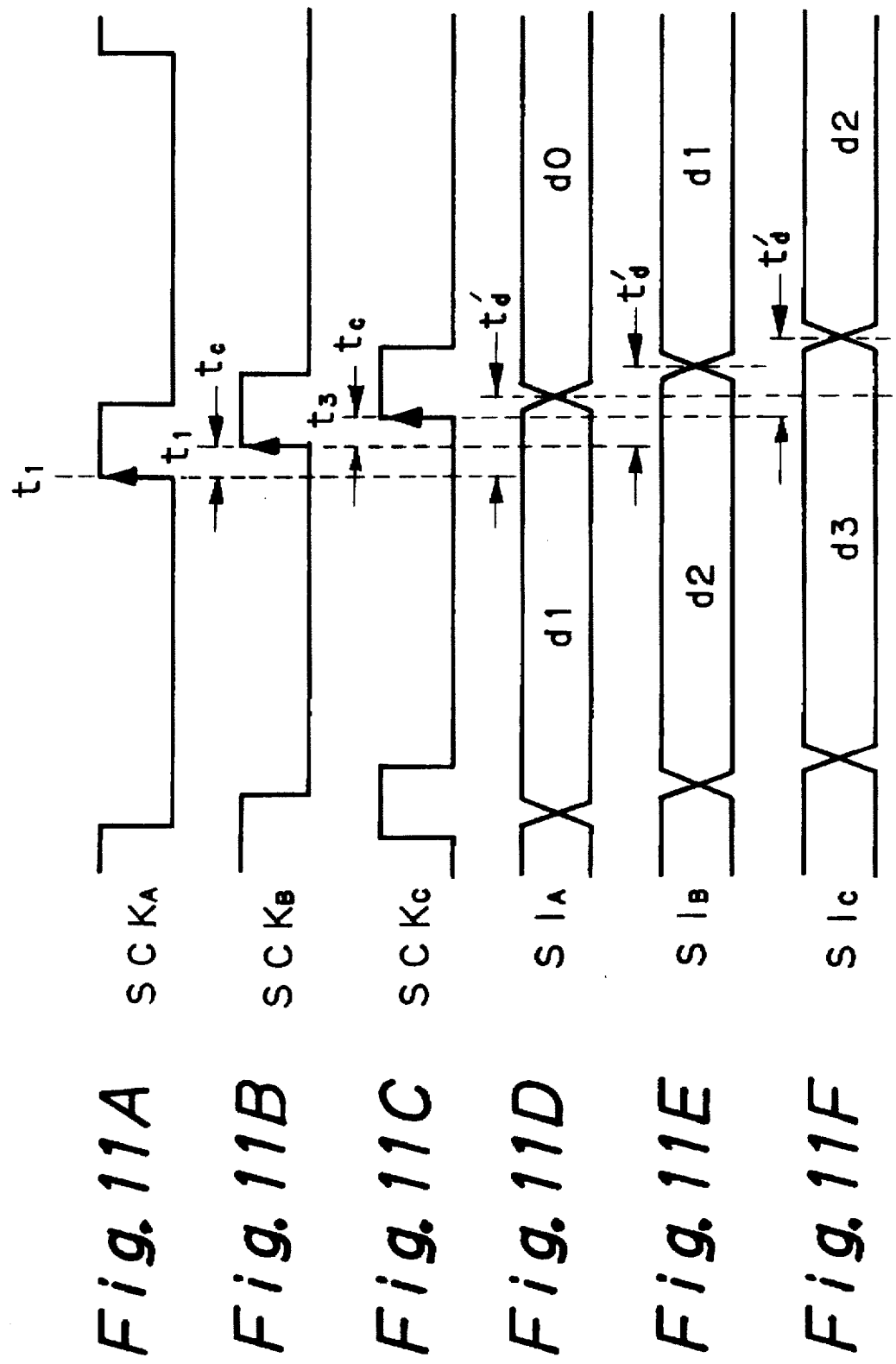
FIGS. 11A through 11F are timing diagrams for explaining the operation of the scan path of FIG. 10.

That is, at time $t_1$, when the scan clock signal $SCK_A$ rises, the scan data at the input SI of the scan register 5-A is changed from d1 to d0 with an operation time $t_d'$ thereof, as shown in FIG. 11D.

At time $t_2$, when the scan clock signal $SCK_B$ rises, the scan data at the input SI of the scan register 5-B is changed from d2 to d1 with an operation time $t_d'$ thereof, as shown in FIG. 11E.

At time $t_3$, when the scan clock signal $SCK_C$ rises, the scan data at the input SI of the scan register 5-C is changed from d3 to d2 with an operation time $t_d'$ thereof, as shown in FIG. 11F.

Thus, the operation time $t_d$ of the scan registers 5-A, 5-B, 5-C, ... is substantially increased.

If $t_c<t_d$, then, $t_c<t_d'$ since $t_d'=t_d+t_c'$. In this case, however, only $t_c<t_d'$ should be satisfied. Therefore, the margin of design of the delay circuits 54-1, 54-2, 54-3 is substantially increased, thus making it easy to design the scan path.

Figure 12:
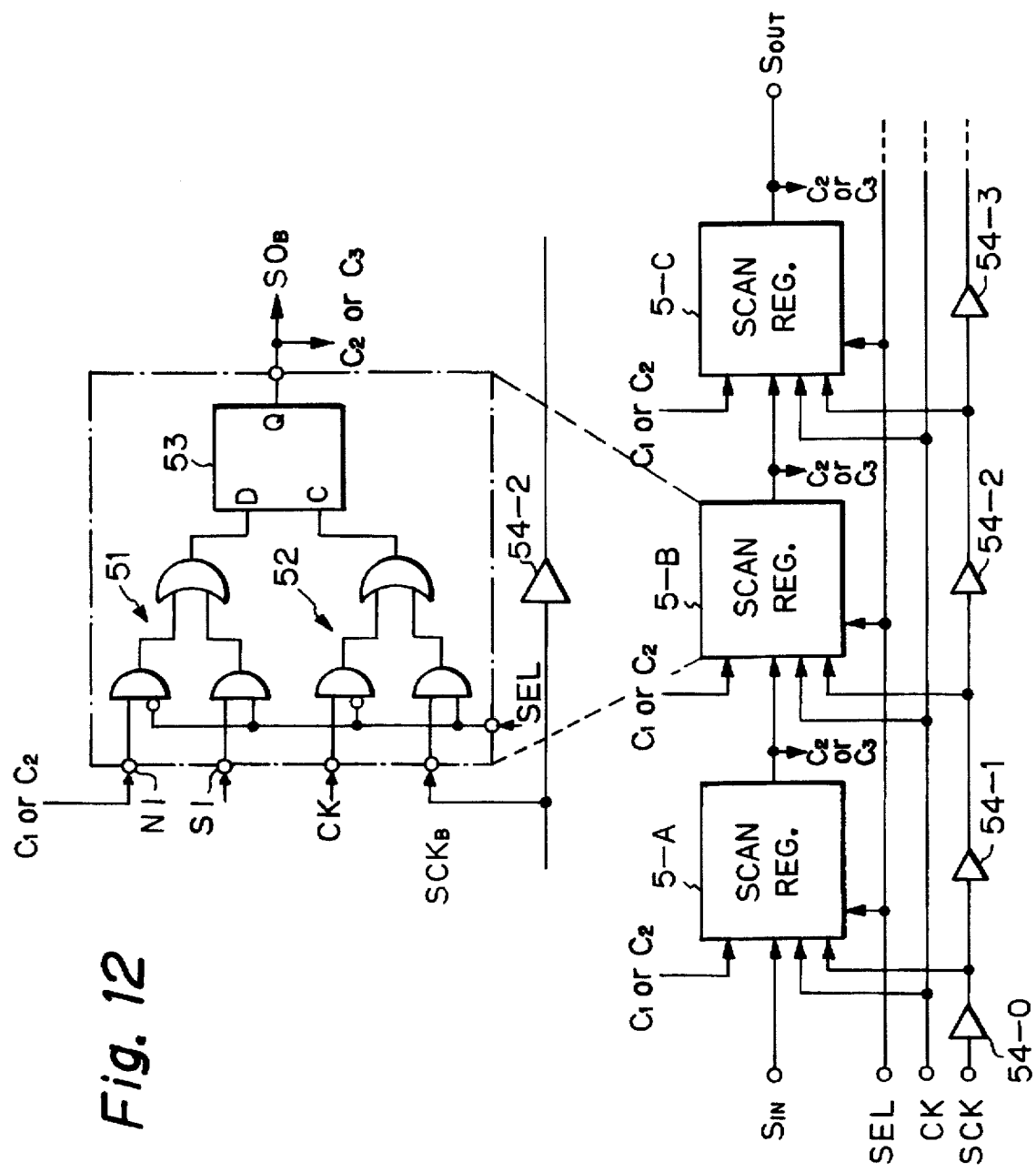
FIGS. 12 and 13 are circuit diagrams illustrating modifications of the scan paths of FIGS. 8 and 10, respectively.
Figure 13:
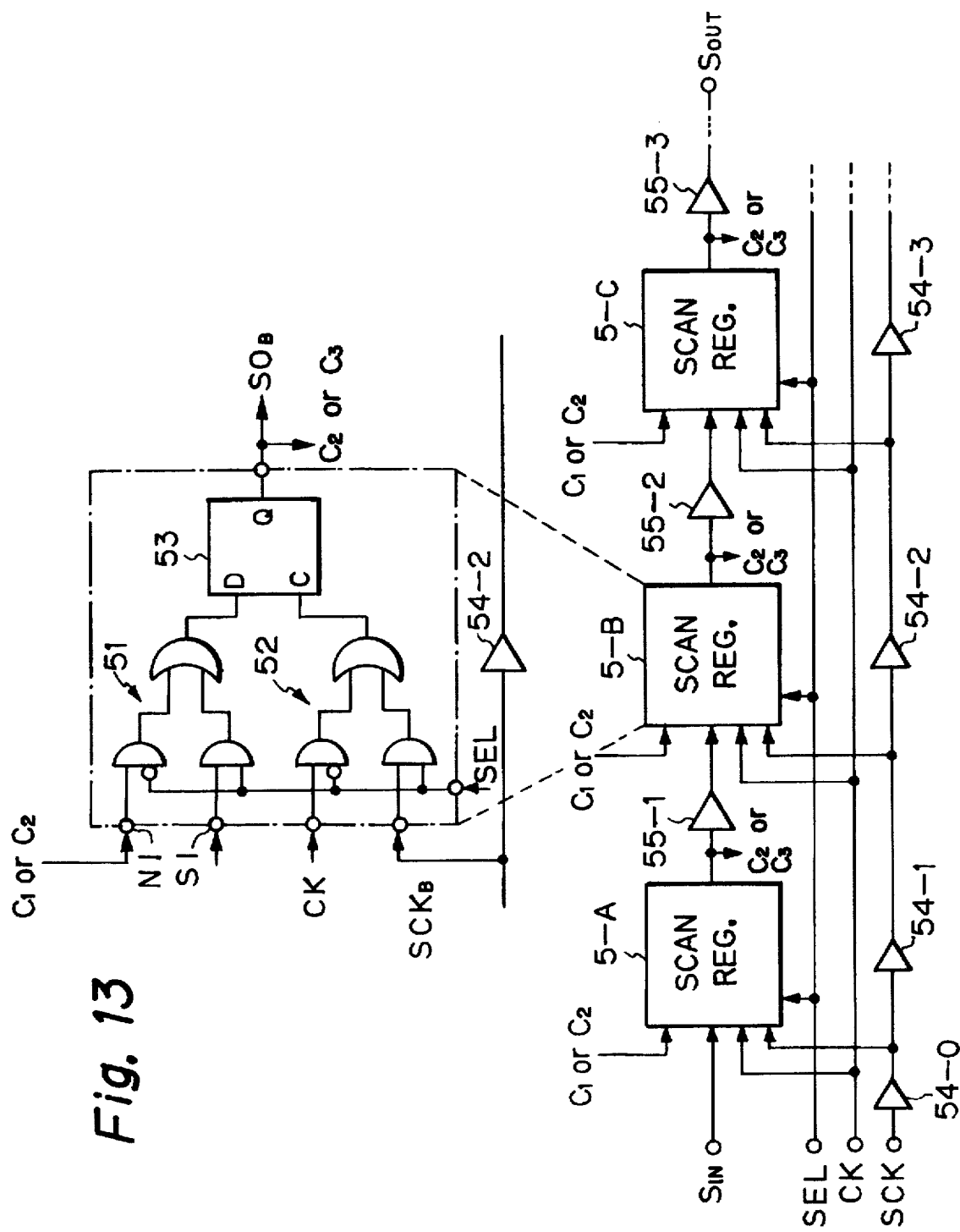

The scan paths of FIGS. 8 and 10 can be modified into FIGS. 12 and 13, respectively. In FIGS. 12 and 13, a delay circuit 54-0 the same as the delay circuits 54-1, 54-2, 54-3, ... is added to the elements of FIGS. 8 and 10, respectively. The operations of the scan paths of FIGS. 12 and 13 are the same as those of the scan paths of FIGS. 8 and 10, respectively.

As explained hereinbefore, according to the present invention, the control of the scan path can be simplified and the design time thereof can be reduced.

I claim:

1. A semiconductor device comprising:
   logic gate combination means;
   a plurality of scan registers including flip-flops which are connected to inputs and outputs of said logic gate combination means in a logic gate operation mode;

a scan-in terminal;

a scan-out terminal;

a scan path directly connecting said scan registers serially to each other between said scan-in terminal and said scan-out terminal in a scan mode such that test data may pass along said scan path directly from scan register to scan register; and means for sequentially generating scan clock signals and transmitting said scan clock signals to said scan registers, respectively, in said scan mode, such that a delay time among scan clock signals is smaller than an operation time of each of said scan registers.

2. The device as set forth in claim 1, wherein said scan clock signal generating means comprises a plurality of first delay circuits, connected in series to each other, for receiving a common scan clock signal each of said first delay circuits having said delay time.

3. A semiconductor device comprising:

logic gate combination means;

a plurality of scan registers including flip-flops which are connected to inputs and outputs of said logic gate combination means in a logic gate operation mode;

a scan-in terminal;

a scan-out terminal;

a scan path for connecting said scan registers serially to each other between said scan-in terminal and said scan-out terminal in a scan mode;

means for sequentially generating scan clock signals and transmitting said scan clock signals to said scan registers, respectively, in said scan mode, such that a delay time among scan clock signals is smaller than an operation time of each of said scan registers; and a plurality of delay circuits, each of said delay circuits being connected between two adjacent ones of said scan registers.

4. A semiconductor device comprising:

logic gate combination means;

a plurality of scan registers including flip-flops which are connected to inputs and outputs of said logic gate combination means in a logic gate operation mode;

a scan-in terminal;

a scan-out terminal;

a scan path for connecting said scan registers serially to each other between said scan-in terminal and said scan-out terminal in a scan mode;

a plurality of first delay circuits, connected in series to each other, for sequentially generating scan clock signals and transmitting said scan clock signals to said scan registers, respectively, in said scan mode; and a plurality of second delay cicuits, each of said second delay circuits being connected between two adjacent ones of said scan registers, a delay time of each of said first delay circuits being smaller than an operation time of each of said scan registers plus a delay time of each of said second delay circuits.

5. A semiconductor device comprising logic gate combination means, a scan-in terminal, a scan-out terminal, a plurality of scan registers connected in series between said scan-in terminal and said scan-out terminal, a mode selection terminal, a normal clock terminal, and a scan clock input terminal, wherein each of said scan registers comprises:

a first selector means for selecting one of a normal data input connected to said logic gate combination means and a scan data input;

a second selector means for selecting one of a normal clock input connected to said normal clock terminal and a scan clock input, wherein said first and second selector means are controlled by a voltage at said mode selection terminal; and a D-type flip-flop having a data input connected to an output of said first selector means, a clock input connected to an output of said second selector means, and an output connected to said logic gate combination means;

said device further comprising a scan path formed by connecting an output of said D-type flip-flop of one of said scan registers to a scan data input of said first selector of another of said scan registers between said scan-in terminal and said scan-out terminal;

said device further comprising a plurality of first delay circuits, connected in series to said scan clock input terminal, for receiving a common scan clock signal at said scan clock input terminal, such that a delay time of each of said first delay circuits is smaller than an operation time of each of said scan registers, and wherein the scan clock input of a first stage one of said scan registers is connected to said scan clock input terminal and the scan clock inputs of post stage ones of said scan registers other than said first stage one are connected to said first delay circuit, respectively.

6. The device as set forth in claim 5, further comprising a plurality of second delay circuits each of said second delay circuits being connected between two adjacent ones of said scan registers in said scan path.

7. A semiconductor device comprising logic gate combination means, a scan-in terminal, a scan-out terminal, a plurality of scan registers connected in series between said scan-in terminal and said scan-out terminal, a mode selection terminal, a normal clock terminal, and a scan clock input terminal, wherein each of said scan registers comprises:

a first selector means for selecting one of a normal data input connected to said logic gate combination means and a scan data input;

a second selector means for selecting one of a normal clock input connected to said normal clock terminal and a scan clock input, wherein said first and second selector means being controlled by a voltage at said mode selection terminal; and a D-type flip-flop having a data input connected to an output of said first selector means, a clock input connected to an output of said second selector means, and an output connected to said logic gate combination means;

said device further comprising a scan path formed by connecting an output of said D-type flip-flop of one of said scan registers to a scan data input of said first selector of another of said scan registers between said scan-in terminal and said scan-out terminal;

said device further comprising a plurality of first delay circuits, connected in series to said scan clock input terminal, for receiving a common scan clock signal at said scan clock input terminal, the scan clock input of a first stage one of said scan registers being connected to said scan clock input terminal, the scan clock inputs of post stage ones of said scan registers other than said first stage one being connected to said first delay circuits, respectively; and a plurality of second delay circuits each of said second delay circuits being connected between two adjacent ones of said scan registers in said scan path, and wherein a delay time of each of said first delay circuits is smaller than an operation time of each of said scan registers plus a delay time of each of said delay circuits.

8. A semiconductor device comprising logic gate combination means, a scan-in terminal, a scan-out terminal, a plurality of scan registers connected in series between said scan-in terminal and said scan-out terminal, a mode selection terminal, a normal clock terminal, and a scan clock input terminal, wherein each of said scan registers comprises:

a first selector means for selecting one of a normal data input connected to said logic gate combination means and a scan data input;

a second selector means for selecting one of a normal clock input connected to said normal clock terminal and a scan clock input, wherein said first and second selector means being controlled by a voltage at said mode selection terminal; and a D-type flip-flop having a data input connected to an output of said first selector means, a clock input connected to an output of said second selector means, and an output connected to said logic gate combination means;

said device further comprising a scan path formed by connecting an output of said D-type flip-flop of one of said scan registers to a scan data input of said first selector of another of said scan registers between said scan-in terminal and said scan-out terminal;

said device further comprising a plurality of first delay circuits, connected in series to said scan clock input terminal, for receiving a common scan clock signal at said scan clock input terminal, a delay time of each of said first delay circuits is smaller than an operation time of each of said scan registers, and wherein the scan clock inputs of said scan registers are connected to first delay circuits, respectively.

9. The device as set forth in claim 8, further comprising a plurality of second delay circuits each of said second delay circuits being connected between two adjacent ones of said scan registers in said scan path.

10. A semiconductor device comprising logic gate combination means, a scan-in terminal, a scan-out terminal, a plurality of scan registers connected in series between said scan-in terminal and said scan-out terminal, a mode selection terminal, a normal clock terminal, and a scan clock input terminal, wherein each of said scan registers comprises:

a first selector means for selecting one of a normal data input connected to said logic gate combination means and a scan data input;

a second selector means for selecting one of a normal clock input connected to said normal clock terminal and a scan clock input, wherein said first and second selector means being controlled by a voltage at said mode selection terminal; and a D-type flip-flop having a data input connected to an output of said first selector means, a clock input connected to an output of said second selector means, and an output connected to said logic gate combination means;

said device further comprising a scan path formed by connecting an output of said D-type flip-flop of one of said scan registers to a scan data input of said first selector of another of said scan registers between said scan-in terminal and said scan-out terminal;

said device further comprising a plurality of first delay circuits, connected in series to said scan clock input terminal, for receiving a common scan clock signal at said scan clock input terminal, the scan clock inputs of said scan registers being connected to said first delay circuits, respectively; and a plurality of second delay circuits each of said second delay circuits being connected between two adjacent ones of said scan registers in said scan path, a delay time of each of said first delay circuits being smaller than an operation time of each of said scan registers plus a delay time of each of said second delay circuits.

11. A device for testing logic circuits comprising:

a plurality of scan registers, each of which is connected to an input and an output of a logic circuit to be tested;

a scan-in terminal;

a scan-out terminal;

a scan path directly connecting said plurality of scan registers serially to each other between said scan-in terminal and said scan-out terminal in a scan mode such that test data may pass along said scan path directly from scan register to scan register; and means for sequentially generating scan clock signals and transmitting said scan clock signals to said scan registers, respectively, in said scan mode such that a delay time among scan clock signals is smaller than an operation time of each of said scan registers.

* * * * *

UNITED STATES PATENT AND TRADEMARK OFFICE
CERTIFICATE OF CORRECTION

PATENT NO.   : 5,719,504
DATED        : February 17, 1998
INVENTOR(S)  : Yamada

It is certified that error(s) appears in the above-identified patent and that said Letters Patent is hereby corrected as shown below:

Column 3, line 1, after "$SR_2$...." insert --$SR_m$,--;

Column 3, line 8, after "$SR_{n-1}$," insert --$SR_n$--;

Column 3, line 9, delete "$SR_n$." and insert --$SR_{n-1}$--.

Signed and Sealed this

Twenty-eighth Day of July, 1998

Attest:

BRUCE LEHMAN

*Attesting Officer*     *Commissioner of Patents and Trademarks*